US012689175B2

(12) United States Patent (10) Patent No.: US 12,689,175 B2
Chung et al. (45) Date of Patent: Jul. 21, 2026

(54) SEMICONDUCTOR DEVICE

(71) Applicants: EPISTAR CORPORATION, Hsinchu (TW); iReach Corporation, Hsinchu (TW)

(72) Inventors: Hsin-Chan Chung, Hsinchu (TW); Shou-Lung Chen, Hsinchu (TW)

(73) Assignees: EPISTAR CORPORATION, Hsinchu (TW); BREACH CORPORATION, Hsinchu (TW)

( * ) Notice: Subject to any disclaimer, the term of this patent is extended or adjusted under 35 U.S.C. 154(b) by 849 days.

(21) Appl. No.: 17/983,947

(22) Filed: Nov. 9, 2022

(65) Prior Publication Data

US 2023/0067254 A1 Mar. 2, 2023

Related U.S. Application Data

(63) Continuation of application No. 16/863,277, filed on Apr. 30, 2020, now Pat. No. 11,532,921.

(30) Foreign Application Priority Data

Apr. 30, 2019 (TW) ................................. 108115024

(51) Int. Cl.
*H01S 5/042* (2006.01)
*H01S 5/0225* (2021.01)
(Continued)

(52) U.S. Cl.
CPC ........ *H01S 5/02315* (2021.01); *H01S 5/0225* (2021.01); *H01S 5/0233* (2021.01);
(Continued)

(58) Field of Classification Search
CPC ...... H01S 5/0225; H01S 5/0235; H01S 5/023; H01S 5/04257; H01S 5/423;
(Continued)

(56) References Cited

U.S. PATENT DOCUMENTS 8,995,485 B2 3/2015 Joseph et al.
10,024,738 B2 7/2018 Conti et al.
(Continued)

FOREIGN PATENT DOCUMENTS

CN 103975491 A 8/2014
JP 2014090071 A 5/2014
(Continued)

*Primary Examiner* — Xinning(Tom) Niu
*Assistant Examiner* — Delma R Forde
(74) *Attorney, Agent, or Firm* — DITTHAVONG, STEINER & MLOTKOWSKI

(57) ABSTRACT

A semiconductor device includes a substrate, a first type semiconductor structure, semiconductor columnar bodies between the substrate and the first type semiconductor structure, a first electrode and a second electrode. The first type semiconductor structure includes a first surface, a second surface opposite the first surface and away from the substrate, a first extension and a second extension respectively extending outward beyond the semiconductor columnar bodies. The first electrode and the second electrode are on the second surface of the first type semiconductor structure.

20 Claims, 10 Drawing Sheets

(51) Int. Cl.

| | |
|---|---|
| *H01S 5/023* | (2021.01) |
| *H01S 5/02315* | (2021.01) |
| *H01S 5/0233* | (2021.01) |
| *H01S 5/0235* | (2021.01) |
| *H01S 5/028* | (2006.01) |
| *H01S 5/183* | (2006.01) |

(52) U.S. Cl.
CPC ............ *H01S 5/0235* (2021.01); *H01S 5/028* (2013.01); *H01S 5/04252* (2019.08); *H01S 5/04254* (2019.08); *H01S 5/04257* (2019.08); *H01S 5/183* (2013.01)

(58) Field of Classification Search
CPC ............... H01S 5/42–426; H01S 5/183; H01S 5/18347; H01S 5/0233–0234
USPC ....................................................... 372/44.01
See application file for complete search history.

(56) References Cited

U.S. PATENT DOCUMENTS

| | | | |
|---|---|---|---|
| 10,461,507 B1 | 10/2019 | Sirbu et al. | |
| 10,535,799 B2 | 1/2020 | Hsu et al. | |
| 10,833,483 B2 | 11/2020 | Yuen | |
| 2008/0279241 A1 | 11/2008 | Oki et al. | |
| 2010/0232465 A1 | 9/2010 | Tsukiji et al. | |
| 2011/0116526 A1 | 5/2011 | Sorimachi et al. | |
| 2018/0331256 A1* | 11/2018 | Hsu ..................... | H01S 5/04256 |
| 2019/0036308 A1 | 1/2019 | Carson et al. | |
| 2019/0237931 A1 | 8/2019 | Pao | |
| 2022/0131338 A1* | 4/2022 | Satou ................. | H10H 20/8506 |

FOREIGN PATENT DOCUMENTS

| | | | |
|---|---|---|---|
| TW | 202522826 | * | 6/2025 |
| WO | 2018035322 A1 | | 2/2018 |

* cited by examiner

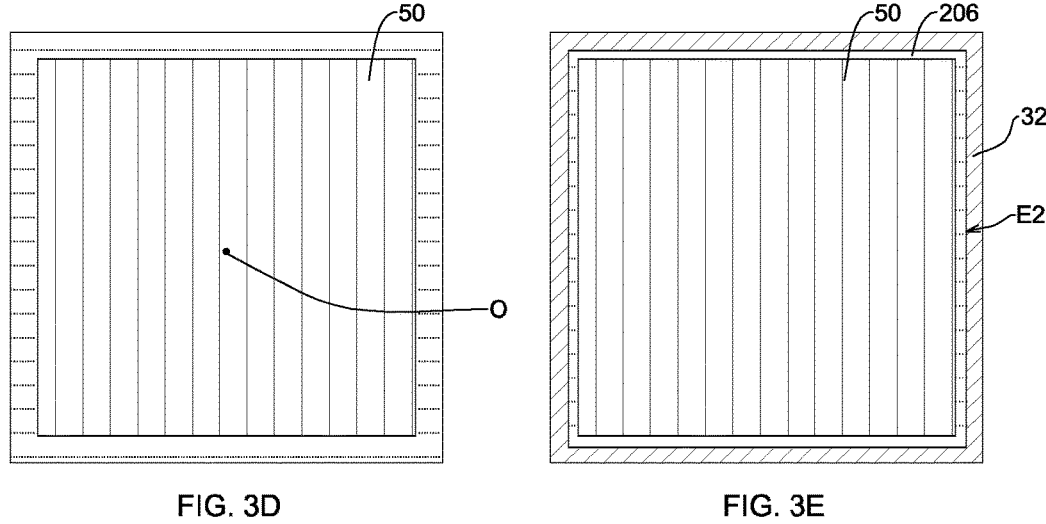
FIG. 3D              FIG. 3E
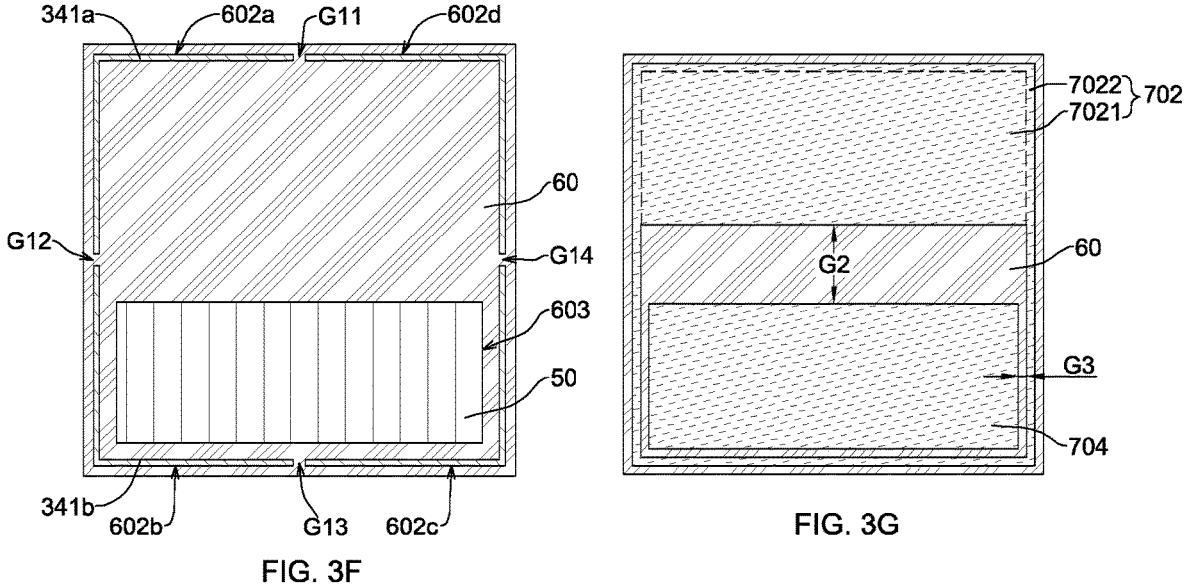
FIG. 3F
FIG. 3G

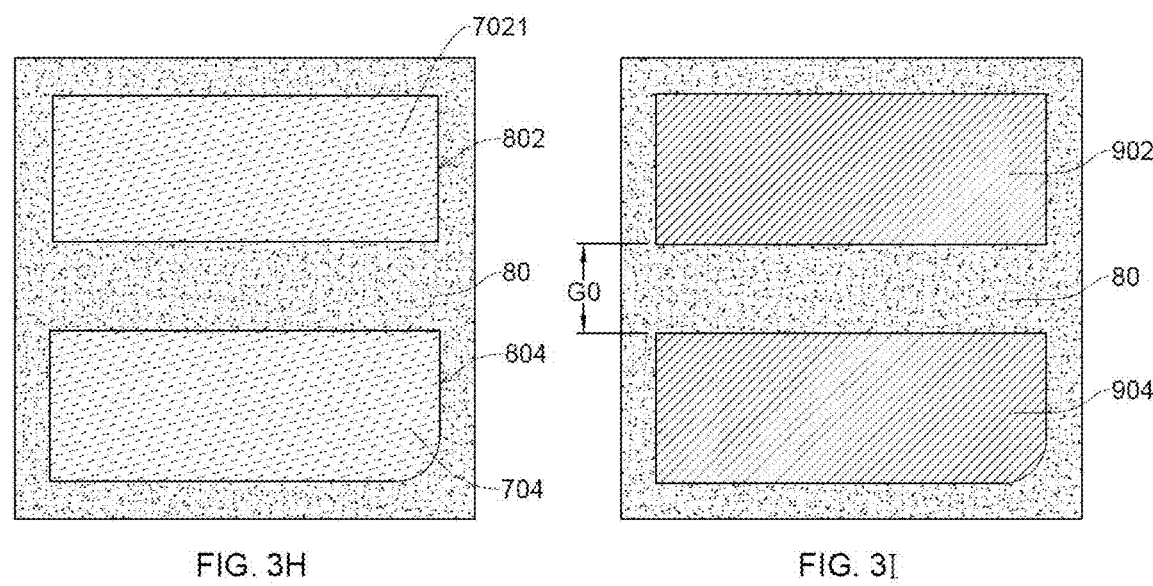
FIG. 3H                  FIG. 3I
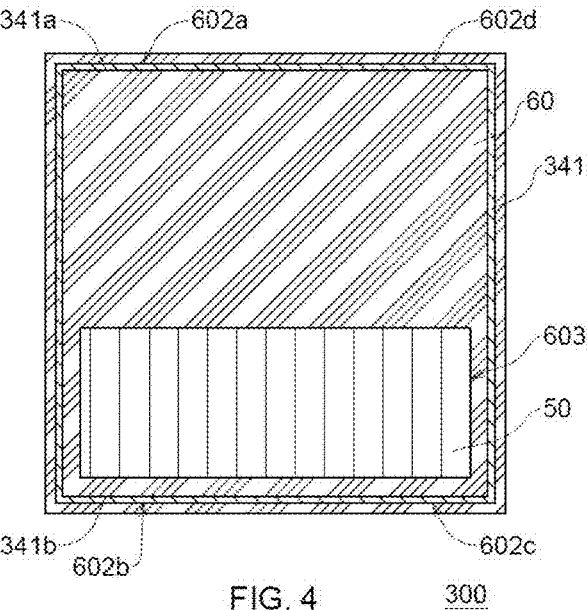
FIG. 4     300
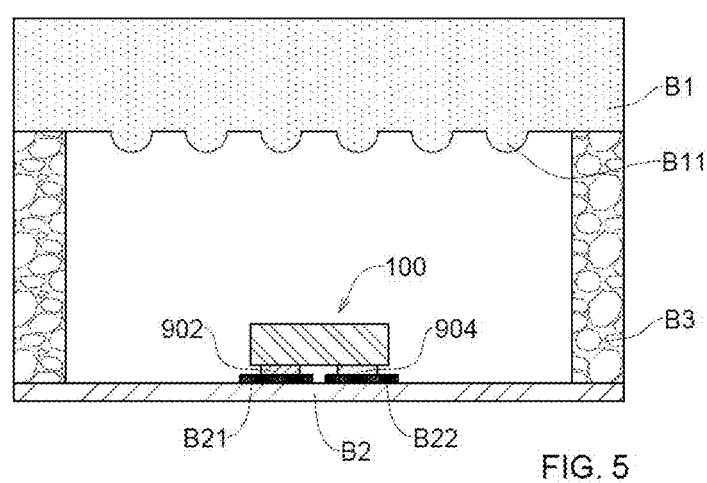
FIG. 5

SEMICONDUCTOR DEVICE

CROSS REFERENCE TO RELATED APPLICATIONS

This application is a continuation application of U.S. patent application Ser. No. 16/863,277, filed on Apr. 30, 2020, which claims the right of priority based on TW Application Serial No. 108115024, filed on Apr. 30, 2019, and the content of which is hereby incorporated by reference in its entirety.

TECHNICAL FIELD

The present disclosure relates to a semiconductor device and, more particularly, to a semiconductor laser device.

DESCRIPTION OF BACKGROUND ART

Vertical Cavity Surface Emitting Laser (VCSEL) is a kind of laser device. One of its applications is data transmission, which is advantageously speedy.

To perform 3D sensing, laser devices must be operated with short pulses and high currents which are required to increase brightness and thus increase sensing distances. Under the high-current driving condition, both current distribution and chip reliability are of vital importance.

SUMMARY OF THE APPLICATION

According to an embodiment of the present disclosure, a semiconductor device is provided. The semiconductor device includes a substrate having a first side surface and a second side surface; semiconductor columnar bodies on the substrate, and the semiconductor columnar bodies including a first columnar body adjacent to the first side surface and a second columnar body adjacent to the second side surface; a first type semiconductor structure on the semiconductor columnar bodies, and the first type semiconductor structure including a first surface, a second surface opposite the first surface and away from the substrate, a first extension extending outward beyond the first column body and a second extension extending outward beyond the second column body; a first electrode on the second surface; and a second electrode on the second surface.

According to an embodiment of the present disclosure, a semiconductor device is provided. The semiconductor device includes a first type semiconductor structure having a first surface, a second surface opposite the first surface, a first lateral surface and a second lateral surface between the first surface and the second surface; semiconductor columnar bodies on the first surface of the first type semiconductor structure, and the semiconductor columnar bodies including a first columnar body adjacent to the first lateral surface and a second columnar body adjacent to the second lateral surface; a connection layer on the semiconductor columnar bodies and extending to the first surface of the first type semiconductor structure; a first electrode on the second surface; and a second electrode on the second surface. The connection layer includes a first protruding portion extending beyond the first lateral surface and a second protruding portion extending beyond the second lateral surface, and the first electrode connects to the first protruding portion and the second electrode connects to the second protruding portion.

BRIEF DESCRIPTION OF THE DRAWINGS

To further explain the technical features of the present disclosure, the present disclosure is hereunder illustrated by embodiments, depicted by accompanying drawings, and described below. However, the accompanying drawings and the description merely serve exemplary and illustrative purposes but are not restrictive of the present disclosure.

FIG. 3A through FIG. 3I are top views or bottom views of respective resultant structures in all the steps of the production process of the laser device according to an embodiment of the present disclosure.

FIG. 4 is a bottom view of the resultant structure in one of the steps of the production process of the laser device according to an embodiment of the present disclosure.

FIG. 5 is a cross-sectional view of a laser apparatus according to an embodiment of the present disclosure.

DETAILED DESCRIPTION OF THE EMBODIMENTS

Figure 1A:
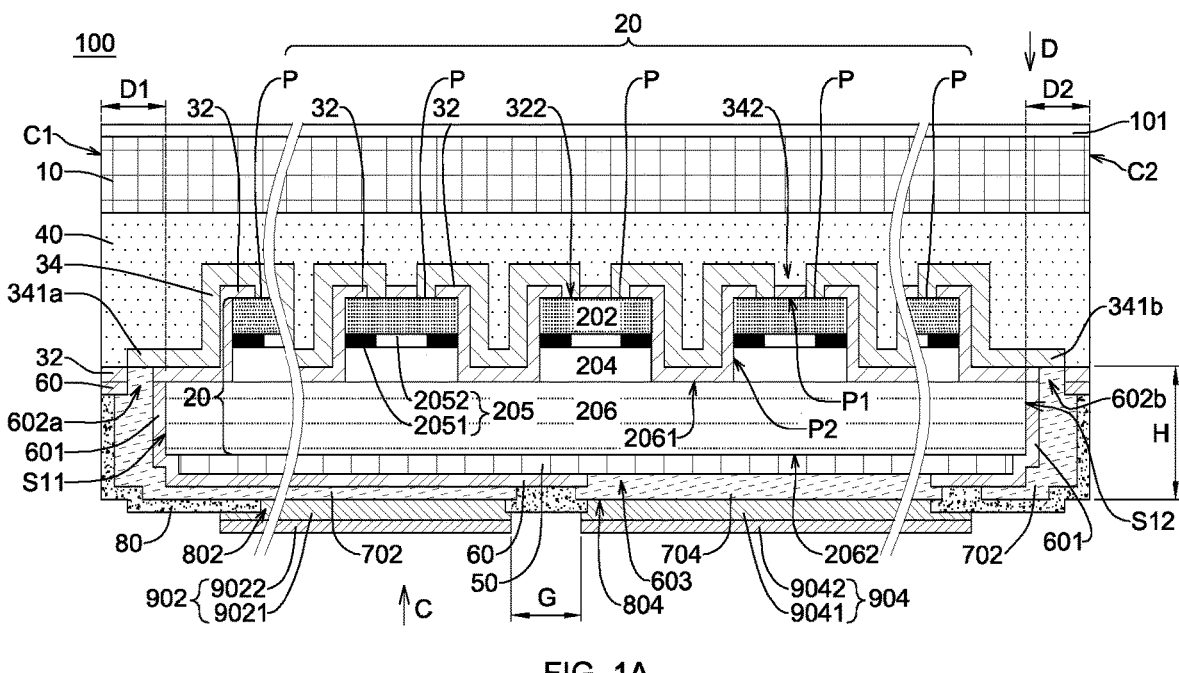
FIG. 1A is a cross-sectional view of a laser device according to an embodiment of the present disclosure.

Concepts embodied in the present disclosure are hereunder illustrated by embodiments, depicted by accompanying drawings, and described below. In the accompanying drawings and the description, similar or identical components are denoted by identical reference numerals. Furthermore, the accompanying drawings only serve an illustrative purpose; thus, layers shown in the accompanying drawings are not drawn to scale in terms of thickness and shape. Components not shown in the accompanying drawings or described hereunder can be provided in whatever forms well-known among persons skilled in the art.

The terms (such as 'first', 'second', 'third' . . . ) used in the specification are provided to mark and/or describe the features of each corresponding embodiment, and those terms (such as 'first', 'second', 'third' . . . ) do not necessarily have any meanings regarding order, hierarchy or sequence (for example, special sequence, time sequence, step sequence, etc.).

Figure 1B:
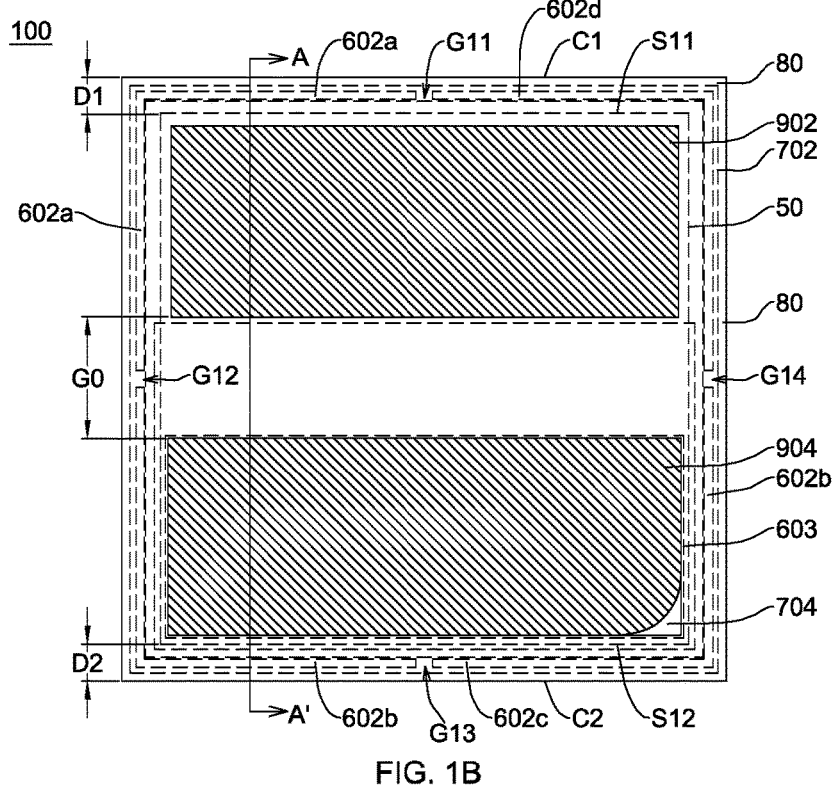
FIG. 1B is a bottom view of the laser device shown in FIG. 1A.
Figure 1C:
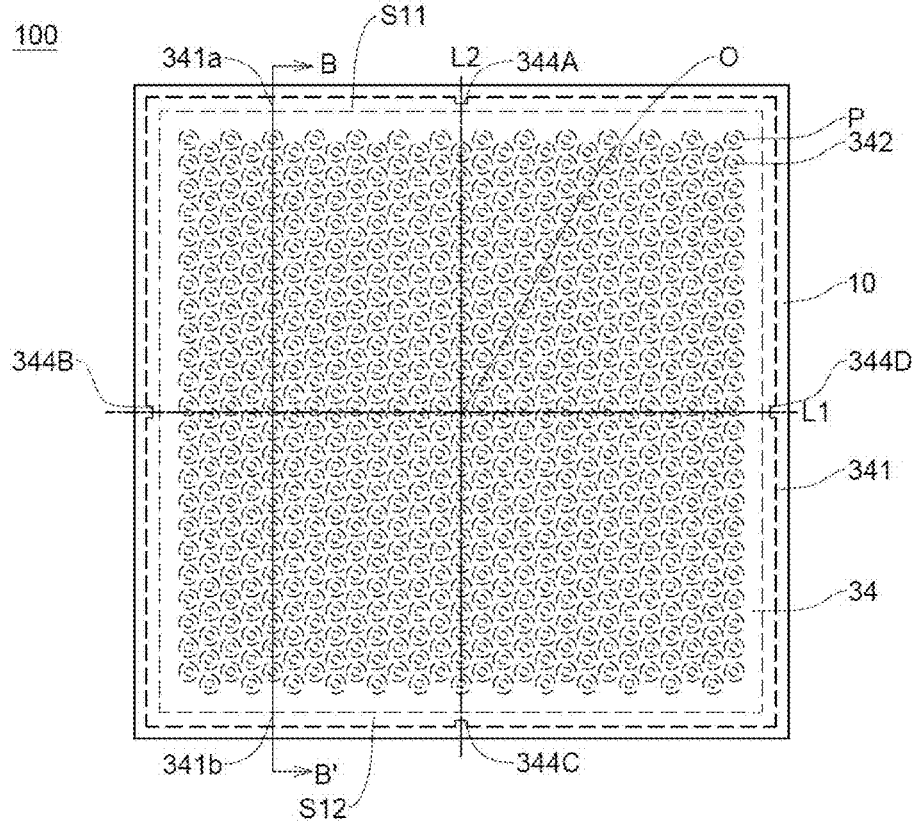
FIG. 1C is a top view of the laser device shown in FIG. 1A.

FIG. 1A shows a cross-sectional view of a semiconductor device according to an embodiment of the present disclosure. FIG. 1B is a bottom view of the laser device shown in FIG. 1A. FIG. 1C is a top view of the laser device shown in FIG. 1A. In this embodiment, the semiconductor device is a laser device 100 and includes a permanent substrate 10 and an epitaxial stack 20 disposed on one side of the permanent substrate 10. The epitaxial stack 20 includes one columnar body P. In this embodiment, the epitaxial stack 20 includes a plurality of columnar bodies P. The columnar bodies P each includes a first semiconductor structure 202, a current confinement layer 205, and an active structure 204 which are sequentially disposed on the permanent substrate 10.

The plurality of columnar bodies P is regularly arranged or randomly arranged on a second semiconductor structure 206. In the regular arrangement scenario, the plurality of columnar bodies P is arranged uniformly and repeatedly. For example, the regularly arranged columnar bodies P are spaced from each other by a substantially identical distance, or the regularly arranged columnar bodies P are arranged along a specific direction. The columnar bodies P each includes an upper surface P1 facing the permanent substrate 10 and a first lateral surface P2 connecting the upper surface P1 and the second semiconductor structure 206. Furthermore, the epitaxial stack 20 further includes a lower surface 2062 away from the permanent substrate 10. The lower surface 2062 is a surface of the second semiconductor structure 206. In this embodiment, the first semiconductor structure 202 is p-type, and the second semiconductor structure 206 is n-type. For the sake of simplicity, FIG. 1A shows just five columnar bodies P and the numbers of the columnar bodies P are varied based on the current and power requirement of an actual product of VCSEL, such 100~1000 columnar bodies P.

The current confinement layer 205 is selectively disposed between the active structure 204 and the first semiconductor structure 202 or between the active structure 204 and the second semiconductor structure 206. The current confinement layer 205 includes a current restriction region 2051 and a current conduction region 2052 surrounded by the current restriction region 2051. The current conduction region 2052 has higher electrical conductivity than the current restriction region 2051 so electrical current can concentrate and circulate within the current conduction region 2052.

In the embodiment, the first semiconductor structure 202 and the active structure 204 cover a portion of the second semiconductor structure 206, thereby exposing a top surface 2061 of the second semiconductor structure 206. The laser device 100 further includes an insulating layer 32 and a connection layer 34. The insulating layer 32 covers the first lateral surfaces P2 of the columnar bodies P, the top surface 2061 of the second semiconductor structure 206, and parts of the upper surfaces P1 of the columnar bodies P. The insulating layer 32 has a plurality of first vias 322 for exposing parts of the upper surfaces P1 therefrom. The connection layer 34 is disposed on the insulating layer 32 and electrically connected to the first semiconductor structure 202 through the first via 322. The connection layer 34 has a plurality of second vias 342 for the light that is emitted from the active structure 204 toward the permanent substrate 10 to exit the laser device 100. Furthermore, the second semiconductor structure 206 has a third lateral surface S11 and a fourth lateral surface S12 opposing the third lateral surface S11. In this embodiment, as the top view shown in FIG. 1C, the connection layer 34 has a protruding area 341, and as the cross-sectional view shown in FIG. 1A, the protruding area 341 of the connection layer 34 has a first protruding portion 341a and a second protruding portion 341b. The first protruding portion 341a extends beyond the third lateral surface S11. The second protruding portion 341b extends beyond the fourth lateral surface S12. The first protruding portion 341a and the second protruding portion 341b are used for an electrical connection which will be described later.

In this embodiment, the laser device 100 further includes an adhesive layer 40 by which the epitaxial stack 20 is connected to the permanent substrate 10. A connection layer 50 is disposed on the second semiconductor structure 206 away from the permanent substrate 10. The connection layer 50 is electrically connected to the second semiconductor structure 206. The laser device 100 of the present disclosure includes an insulating layer 60 covering the connection layer 50. The insulating layer 60 has two lateral portions 601. The insulating layer 60 further has four opening portions (a first opening portion 602a, a second opening portion 602b, a third opening portion 602c, and a fourth opening portion 602d) penetrating therethrough. The lateral portion 601 covers the third lateral surface S11 and the fourth lateral surface S12 of the second semiconductor structure 206. The first opening portion 602a (and the fourth opening portion 602d) further penetrates the insulating layer 32 so the first protruding portion 341a of the connection layer 34 is exposed. The second opening portion 602b (and the third opening portion 602c) further penetrates the insulating layer 32 to expose the second protruding portion 341b of the connection layer 34. The insulating layer 60 further has a fifth opening portion 603 for exposing the connection layer 50. The laser device 100 of the present disclosure further includes a first electrode 702 and a second electrode 704. The first electrode 702 and the second electrode 704 are disposed on the same side of the permanent substrate 10 and physically separated from each other.

In this embodiment, the laser device 100 is a flip-chip laser device and is subsequently connected to an external circuit (such as PCB) by solder. The first electrode 702 is connected to the connection layer 34 through the opening portions 602a~602d and electrically connected to the first semiconductor structure 202 through the first protruding portion 341a and the second protruding portion 341b of the connection layer 34. The first electrode 702 not only covers the lateral portion 601 of the insulating layer 60 but also extends to cover the connection layer 50. The insulating layer 60 is disposed between the first electrode 702 and the connection layer 50 to prevent from developing a short-circuit path. The second electrode 704 is connected to the connection layer 50 through the fifth opening portion 603, such that the second electrode 704 is electrically connected to the second semiconductor structure 206.

The laser device 100 of the present disclosure further includes a first pad structure 902 and a second pad structure 904 which are disposed on the first electrode 702 and the second electrode 704, respectively. The laser device 100 of the present disclosure further includes an insulating layer 80 which covers the first electrode 702 and the second electrode 704. The insulating layer 80 has a first hole 802 for exposing the first electrode 702 and a second hole 804 for exposing the second electrode 704. The first pad structure 902 is electrically connected to the first electrode 702 through the first hole 802. The second pad structure 904 is electrically connected to the second electrode 704 through the second hole 804. Furthermore, the first pad structure 902 and the second pad structure 904 are separated by a first gap G0 of 10 μm to 200 μm. In this embodiment, from a bottom view of the laser device 100, the first pad structure 902 differs from the second pad structure 904 in shape to facilitate polarity recognition (as shown in FIG. 3I).

The laser device 100 of the present disclosure optionally includes an anti-reflective structure 101 disposed on the permanent substrate 10 away from the first electrode 702 and the second electrode 704. Because of the anti-reflective structure 101, light emitted from the laser device 100 is less likely to reflect off the boundary between the permanent substrate 10 and air, so as to prevent reduction in the efficiency of light emission of the laser device 100 or prevent the laser device 100 from generating undesirable light pattern. The anti-reflective structure 101 is a monolayer or a multilayer. When it is a monolayer, the anti-reflective structure 101 has a refractive index which falls between the refractive index of the permanent substrate 10 and the refractive index of the surroundings (such as air). For instance, the monolayer anti-reflective structure 101 has a refractive index of 1.1~1.65 and is made of $SiO_x$ or $MgF_2$. The thickness of the anti-reflective structure 101 is preferably a multiple of a quarter of the wavelength of the light emitted from the active structure 204. Given a wavelength λ of the emitted light, the thickness of the anti-reflective structure 101 is expressed by (λ/4)×n, where n is an integer greater than or equal to 1. The anti-reflective structure 101 can be a multilayer of high refractive index materials and low refractive index materials which are stacked alternately, such as $SiO_x/TiO_x$, $SiO_x/TiO_x/SiO_x$.

In this embodiment, the first semiconductor structure 202 and the second semiconductor structure 206 includes a plurality of layers with different refractive indexes which are stacked alternately (for example, AlGaAs layer with high aluminum content and AlGaAs layer with low aluminum content are stacked alternately) and periodically to form Distributed Bragg Reflector (DBR) such that light emitted from the active structure 204 reflects off two DBRs to generate coherent light. The reflectance of the first semiconductor structure 202 is lower than the reflectance of the second semiconductor structure 206 such that the coherent light propagates toward the permanent substrate 10. The first semiconductor structure 202, the second semiconductor structure 206, and the active structure 204 are made of III-V compound semiconductors, such as AlGaInAs group, AlGaInP group, AlInGaN group, AlAsSb group, InGaAsP group, InGaAsN group, and AlGaAsP group, such as AlGaInP, GaAs, InGaAs, AlGaAs, GaAsP, GaP, InGaP, AlInP, GaN, InGaN, or AlGaN. Unless otherwise specified in this embodiment, the aforesaid chemical formulas include stoichiometric compounds and non-stoichiometric compounds. The compounds are stoichiometric when, for example, the total stoichiometric amount of group III elements is equal to the total stoichiometric amount of group V elements. The compounds are non-stoichiometric when, for example, the total stoichiometric amount of group III elements is not equal to the total stoichiometric amount of group V elements. For instance, the chemical formula AlGaInAs group includes group III elements, such as aluminum (Al) and/or gallium (Ga) and/or indium (In) and includes group V element arsenic (As), wherein the total stoichiometric amount of group III elements (aluminum and/or gallium and/or indium) is the same as or different from the total stoichiometric amount of group V element (arsenic). In addition, when the aforesaid compounds expressed by chemical formulas are stoichiometric compounds, the consequence is as follows: AlGaInAs group is expressed by $(Al_{y1}Ga_{(1-y1)})_{1-x1}In_{x1}As$, where $0 \leq x1 \leq 1$, $0 \leq y1 \leq 1$; AlGaInP group is expressed by $(Al_{y2}Ga_{(1-y2)})_{1-x2}In_{x2}P$, where $0 \leq x2 \leq 1$, $0 \leq y2 \leq 1$; AlInGaN group is expressed by $(Al_{y3}Ga_{(1-y3)})_{1-x3}In_{x3}N$, where $0 \leq x3 \leq 1$, $0 \leq y3 \leq 1$; AlAsSb group is expressed by $AlAs_{x4}Sb_{(1-x4)}$, where $0 \leq x4 \leq 1$; InGaAsP group is expressed by $In_{x5}Ga_{1-x5}As_{1-y4}P_{y4}$, where $0 \leq x5 \leq 1$, $0 \leq y4 \leq 1$; InGaAsN group is expressed by $In_{x6}Ga_{1-x6}As_{1-y5}N_{y5}$, where $0 \leq x6 \leq 1$, $0 \leq y5 \leq 1$; and AlGaAsP group is expressed by $Al_{x7}Ga_{1-x7}As_{1-y6}P_{y6}$, where $0 \leq x7 \leq 1$, $0 \leq y6 \leq 1$.

Depending on the materials it is made of, the active structure 204 emits infrared light with a peak wavelength of 700 nm to 1700 nm, red light with a peak wavelength of 610 nm to 700 nm, yellow light with a peak wavelength of 530 nm to 570 nm, green light with a peak wavelength of 490 nm to 550 nm, blue light or dark blue light with a peak wavelength of 400 nm to 490 nm, or ultraviolet with a peak wavelength of 250 nm to 400 nm. In this embodiment, the active structure 204 emits infrared light with a peak wavelength of 750 nm to 1200 nm.

The current confinement layer 205 is made of the aforesaid III-V semiconductor materials. In this embodiment, the current confinement layer 205 is made of AlGaAs, and the active structure 204, the first semiconductor structure 202, and the second semiconductor structure 206 are made of aluminum-containing materials. The current confinement layer 205 has greater aluminum content than the active structure 204, the first semiconductor structure 202, and the second semiconductor structure 206 do. For instance, the current confinement layer 205 has aluminum content greater than 97%. In this embodiment, the current restriction region 2051 has greater oxygen content than the current conduction region 2052, such that the current restriction region 2051 has lower electrical conductivity than the current conduction region 2052 does. The adhesive layer 40 is made of a material which is highly penetrable by the light emitted from the active structure 204 (such as with transmittance greater than 80%). The adhesive layer 40 is made of an insulating material, such as B-staged bisbenzocyclobutene (BCB), epoxy resin, polyimide, SOG (spin-on glass), silicone, or perfluorocyclobutane (PFCB).

The insulating layer 32, the insulating layer 60 and the insulating layer 80 are made of electrically non-conductive materials. The electrically non-conductive materials include organic materials or inorganic materials. The organic materials include Sub, benzocyclobutene (BCB), perfluorocyclobutane (PFCB), epoxy, acrylic resin, cyclic olefin copolymer (COC), poly(methyl methacrylate) (PMMA), polyethylene terephthalate (PET), polycarbonates (PC), polyetherimide, and fluorocarbon polymer. The inorganic materials include silicone, glass, aluminum oxide ($Al_2O_3$), silicon nitride ($SiN_x$), silicon oxide ($SiO_x$), titanium oxide ($TiO_x$), and magnesium fluoride ($MgF_x$). In an embodiment, the insulating layer 32, the insulating layer 60 and/or the insulating layer 80 include a single layer or a multilayer (such as distributed Bragg reflector (DBR) stacked by two sub-layers alternately, such as $SiO_x$ sub-layer and $TiO_x$ sub-layer).

The connection layer 34 and the connection layer 50 are metal made of aluminum (Al), silver (Ag), chromium (Cr), platinum (Pt), nickel (Ni), germanium (Ge), beryllium (Be), gold (Au), titanium (Ti), tungsten (W) or zinc (Zn). The first electrode 702 and the second electrode 704 are made of metal, such as gold (Au), tin (Sn), titanium (Ti) or an alloy thereof. In this embodiment, the first electrode 702 is of a multilayer electrode structure including a titanium (Ti) layer and a gold (Au) layer which are arranged sequentially in the direction away from the permanent substrate 10. The second electrode 704 and the first electrode 702 are made of the same material and have the same structure. The first pad structure 902 and the second pad structure 904 are made of metal, such as gold (Au), tin (Sn), titanium (Ti), copper (Cu), nickel (Ni) or platinum (Pt), or an alloy thereof. The material of the first electrode 702 is different from that of the first pad structure 902. The material of the second electrode 704 is different from that of the second pad structure 904. For instance, the first pad structure 902 and the second pad structure 904 include an element, but neither the first electrode 702 nor the second electrode 704 includes the element, so as to preclude electrical failure caused by a damage to the first electrode 702 and the second electrode 704 from external solder (tin-containing) during a die bonding process or a high-current operation for improving the reliability of the laser device 100 of the present disclosure. The element stops the solder from diffusing into the first electrode 702 and the second electrode 704. The element is, such as, nickel (Ni) and/or platinum (Pt). Specifically, each of the first pad structure 902 and the second pad structure 904 is a multilayer including a middle layer 9021, 9041 and a coupling layer 9022, 9042 which are arranged sequentially in the direction away from the permanent substrate 10. The materials of the middle layers 9021, 9041 are different from the material of the first electrode 702 and the second electrode 704, so as to prevent solder (such as tin or gold-tin alloy (AuSn)) from diffusing into the first electrode 702 and the second electrode 704. Preferably, the materials of the middle layers 9021, 9041 include a metal element other than gold (Au), tin (Sn), and copper (Cu), such as, nickel (Ni) and/or platinum (Pt). The materials of the coupling layers 9022, 9042 include a metal with high ductility, such as gold (Au). In this embodiment, the middle layers 9021, 9041 are made of platinum (Pt) and nickel (Ni) which are arranged sequentially in the direction away from the permanent substrate 10, and the coupling layers 9022, 9042 are made of gold (Au). Therefore, in the present embodiment, in the direction away from the permanent substrate 10, the first and second pad structures 902, 904 include sequentially a nickel layer, a platinum layer, and a gold layer.

FIG. 1B is a bottom view (viewed in the direction of the arrow C in FIG. 1A, i.e., viewed from the first pad structure 902 and the second pad structure 904) of the laser device 100 shown in FIG. 1A. FIG. 1A is a cross-sectional view taken along line A-A' of FIG. 1B. FIG. 1C is an upper view (viewed in the direction of the arrow D in FIG. 1A, i.e., viewed from the direction of the permanent substrate 10) of the laser device 100 shown in FIG. 1A. FIG. 1A is a cross-sectional view taken along line B-B' of FIG. 1C.

Referring to FIGS. 1A and 1B, the substrate 10 has a central region and a peripheral region surrounding the central region. The insulating layer 60 has a plurality of opening portions, such as a first opening portion 602a, a second opening portion 602b, a third opening portion 602c, and a fourth opening portion 602d, distributed within the peripheral region of the substrate 10. Furthermore, there are four spacing G11~G14 between the four opening portions 602a~602d. More specifically, the first opening portions 602a and the fourth opening portion 602d are separated by the first spacing G11, the first opening portion 602a and the second opening portion 602b are separated by the second spacing G12, the second opening portions 602b and the third opening portion 602c are separated by the third spacing G13, and the third opening portions 602c and the fourth opening portion 602d are separated by the fourth spacing G14.

Furthermore, as shown in FIG. 1C, in this embodiment, the connection layer 34 is provided with a plurality of marking structures 344A~344D to facilitate mechanical recognition and subsequent packaging processes. The marking structures 344B, 344D are opposite to each other and connected to define the line L1, and the marking structures 344A, 344C are opposite to each other and connected to define the line L2. The line L1 and the line L2 are intersected at a central point O. Referring FIGS. 1B and 1C, the marking structure 344A corresponds to the first spacing G11, the marking structure 344B corresponds to the second spacing G12, the marking structure 344C corresponds to the third spacing G13, and the marking structure 344D corresponds to the fourth spacing G14. The dashed lines in FIG. 1B and FIG. 1C indicate the outlines of the structures which are not seen when viewed from below/above.

In this embodiment, the second semiconductor structure 206 can be positioned on the center region of the permanent substrate 10. In one embodiment, the distance between any lateral surface of the second semiconductor structure 206 and the corresponding side surface of the permanent substrate 10 is substantially constant, allowing the first pad structure 902 and the second pad structure 904 (or the first electrode 702 and the second electrode 704) to be located symmetrically to the line L1 for facilitating a subsequent packaging process and increasing effective area for connecting to an external circuit. As shown in FIG. 1B, when viewed in the direction from the second semiconductor structure 206 to the active structure 204, the permanent substrate 10 has a first side surface C1 adjacent to the third lateral surface S11 and a second side surface C2 opposite to the first side surface C1 and adjacent to the fourth lateral surface S12. The first side surface C1 and the second side surface C2 are opposite to each other. The difference between a first shortest distance D1 between the third lateral surface S11 and the first side surface C1 and a second shortest distance D2 between the fourth lateral surface S12 and the second side surface C2 is less than 30% of the first shortest distance D1, that is, the inequation is $0 \leq (D1-D2)/D1 < 30\%$. In another embodiment, the inequation is $0 \leq (D1-D2)/D1 < 20\%$, and preferably $0 \leq (D1-D2)/D1 < 15\%$. In another embodiment, the inequation is $1\% < (D1-D2)/D1 < 10\%$. In this embodiment, the first shortest distance D1 is equal to the second shortest distance D2.

FIG. 2A through FIG. 2L show the process of making the laser device 100 of the present disclosure.

Figure 2A:
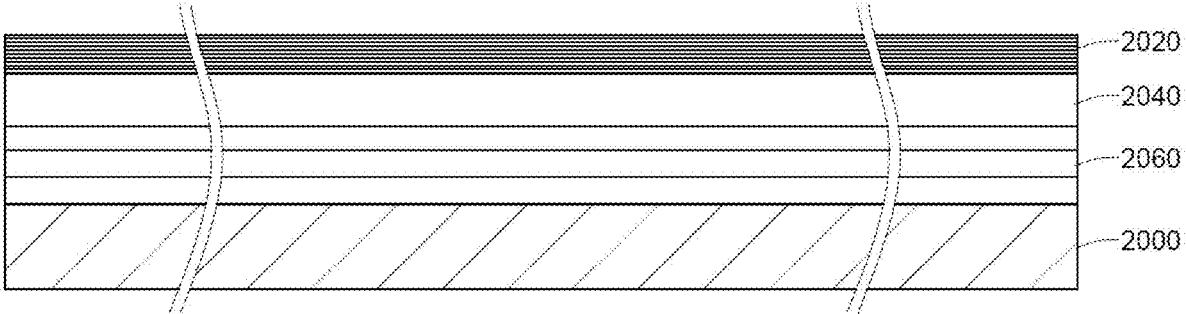
FIG. 2A through FIG. 2L are cross-sectional views of respective resultant structures in all the steps of a production process of the laser device according to an embodiment of the present disclosure.

Referring to FIG. 2A, a second semiconductor stack 2060, an active stack 2040 and a first semiconductor stack 2020 are sequentially epitaxially grown on the growth substrate 2000. The epitaxial growth includes metal organic chemical vapor deposition, hydride vapor phase epitaxy, molecular beam epitaxy, and liquid-phase epitaxy. The growth substrate 2000 is made of III-V compounds, and its lattice constant matches the second semiconductor stack 2060, the active stack 2040 and the first semiconductor stack 2020. In this embodiment, the growth substrate 2000 is made of gallium arsenide (GaAs). In another embodiment, the growth substrate 2000 is made of indium phosphide (InP), sapphire, gallium nitride (GaN) or silicon carbide (SiC).

Figure 2B:
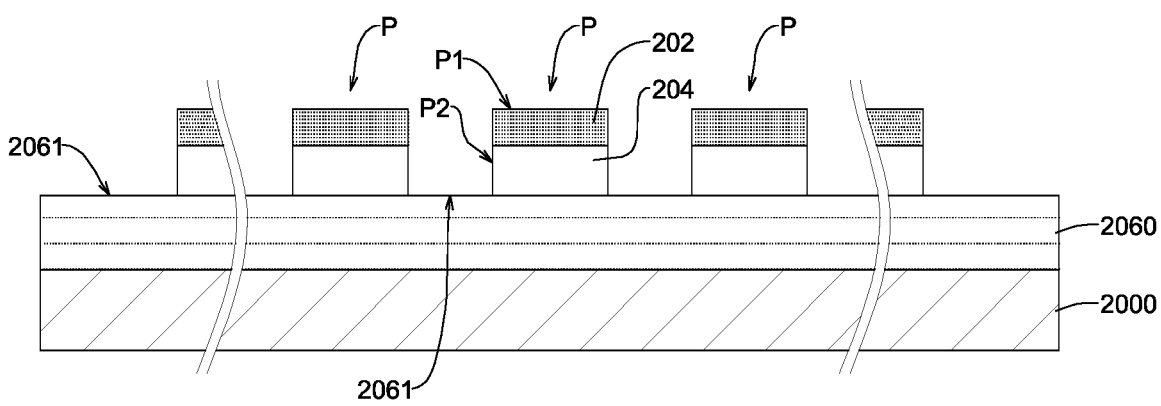

Next, an etching process is performed to etch and remove a part of the first semiconductor stack 2020 and a part of the active stack 2040, so as to form the plurality of columnar bodies P and expose the top surface 2061 of the second semiconductor stack 2060. Each columnar body P includes a first semiconductor structure 202 and an active structure 204 and has an upper surface P1 and a first lateral surface P2. The first lateral surface P2 connects the upper surface P1 and the top surface 2061, as shown in FIG. 2B.

Figure 2C:
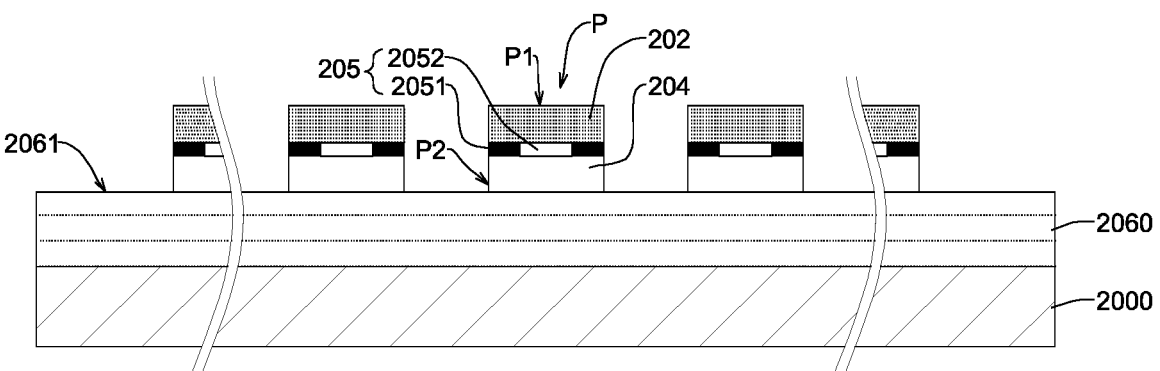

Next, the current confinement layer 205 is formed in each columnar body P, so as to form the structure shown in FIG. 2C. In this embodiment, the current confinement layer 205 is formed between each first semiconductor structure 202 and a corresponding active structure 204. Each current confinement layer 205 includes the current restriction region 2051 and the current conduction region 2052 surrounded by the current restriction region 2051. The current confinement layer 205 is formed by an oxidation process oxidizing the region designed to be the current restriction region 2051. For instance, the first semiconductor structure 202 includes a plurality of AlGaAs layers with high aluminum content and a plurality of AlGaAs layers with low aluminum content, which have different refractive indexes and are stacked up alternately and periodically. All the materials which the active structure 204, the first semiconductor structure 202 and the second semiconductor structure 206 are made of contain aluminum. One layer of the first semiconductor structure 202 has aluminum content greater than 97% (and is defined as the current confinement layer 205) and greater than the aluminum contents of the active structure 204, the other layers of the first semiconductor structure 202, and the second semiconductor structure 206. Since the aluminum content of the current confinement layer 205 is greater than the aluminum content of the active structure 204, the other layers of the first semiconductor structure 202 and the second semiconductor structure 206, the current confinement layer 205 has been significantly oxidized after the oxidation process, thereby having the current restriction region 2051 with low electrical conductivity. Alternatively, an ion implantation process is performed to form the current restriction regions 2051 with low electrical conductivity in the columnar bodies P, and the current conduction regions 2052 are defined by photomasks. The ion implantation process is conducted by implanting hydrogen ions (H⁺), helium ions (He⁺) or argon ions (Ar⁺) in the region designed to have the current restriction region 2051. The current restriction region 2051 has higher ion concentration than the current conduction region 2052, such that the current restriction region 2051 has low electrical conductivity. In another embodiment, the oxidation process and the ion implantation process are simultaneously performed to have the current restriction regions 2051 in the columnar bodies P. For instance, the current restriction regions 2051 in some columnar bodies P are formed by the ion implantation process, and the current restriction regions 2051 in other columnar bodies P are formed by the oxidation process. Alternatively, some columnar bodies P have the current restriction regions formed by both of the ion implantation process and the oxidation process.

Figure 2D:
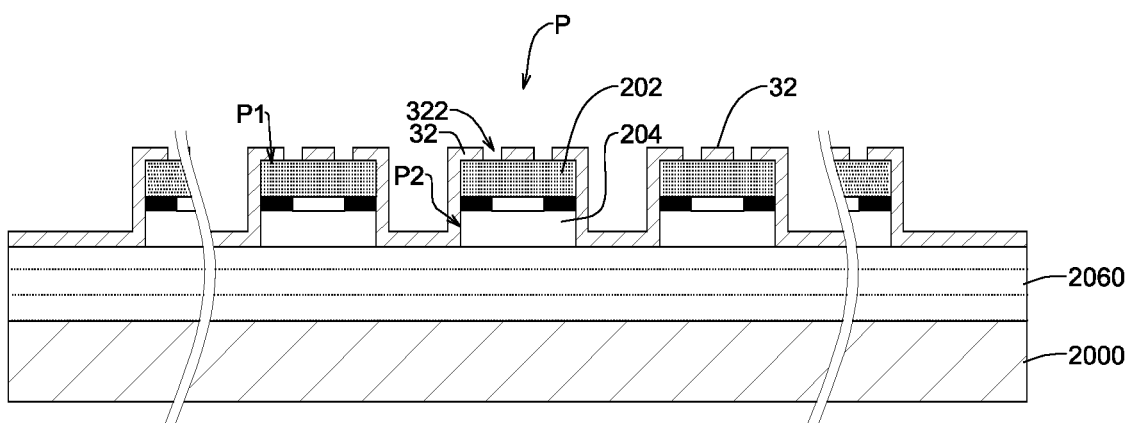

Referring to FIG. 2D, the insulating layer 32 is provided to cover the first lateral surfaces P2 of the columnar bodies P, the second semiconductor structure 206, and parts of the upper surfaces P1 of the columnar bodies P. The insulating layer 32 has a plurality of first vias 322 for exposing parts of the upper surfaces P1. In a top view, the first via 322 is of, such as, round, elliptical, square, or irregular shape. In this embodiment, the first via 322 is ring-shaped (see also the subsequent description about FIG. 3B). In this embodiment, each of the upper surfaces P1 of the columnar bodies P has one first via 322 disposed thereon. In another embodiment, each of the upper surfaces P1 of the columnar bodies P has a plurality of first vias 322 disposed thereon.

Figure 2E:
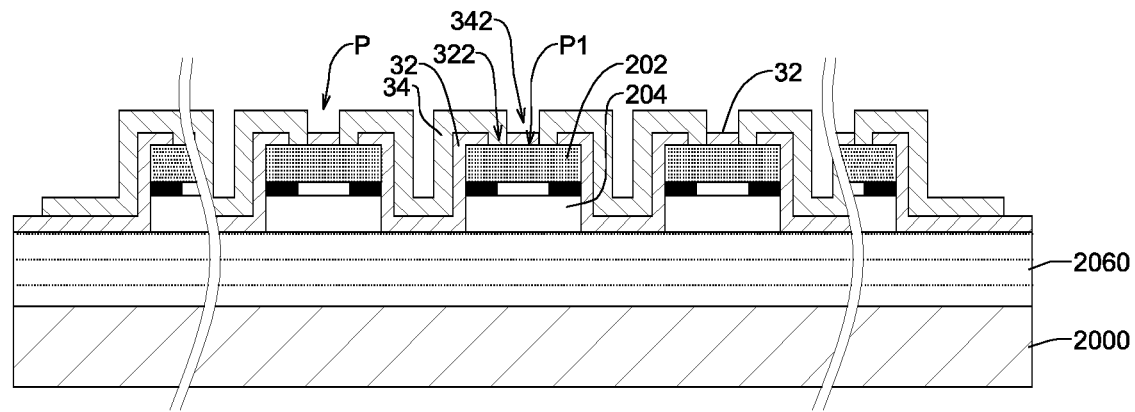

Referring to FIG. 2E, the connection layer 34 is disposed on the insulating layer 32. The connection layer 34 covers the insulating layer 32 and fills into the first vias 322, and the connection layer 34 is electrically connected to the first semiconductor structure 202. The connection layer 34 has a plurality of second vias 342 on the upper surfaces P1 of the columnar bodies s P to expose the insulating layer 32 below, such that light generated from the active structure 204 propagates and exits the laser device 100 through the second vias 342. When viewed from above, the second via 342 of the connection layer 34 is round, elliptical, square, or of irregular shape. In this embodiment, the second via 342 is round (see also the subsequent description about FIG. 3C) when viewed from above. In this embodiment, the connection layer 34 has a plurality of second vias 342 and each second via 342 is substantially located at a central point of the upper surface P1 of the corresponding columnar body P, that is, one-to-one correspondence is between the columnar body P and the second via 342. In another embodiment, a plurality of second vias 342 is on the upper surface P1 of the corresponding columnar body P, that is, one-to-multiple correspondence is between the columnar body P and the second via 342.

Figure 2F:
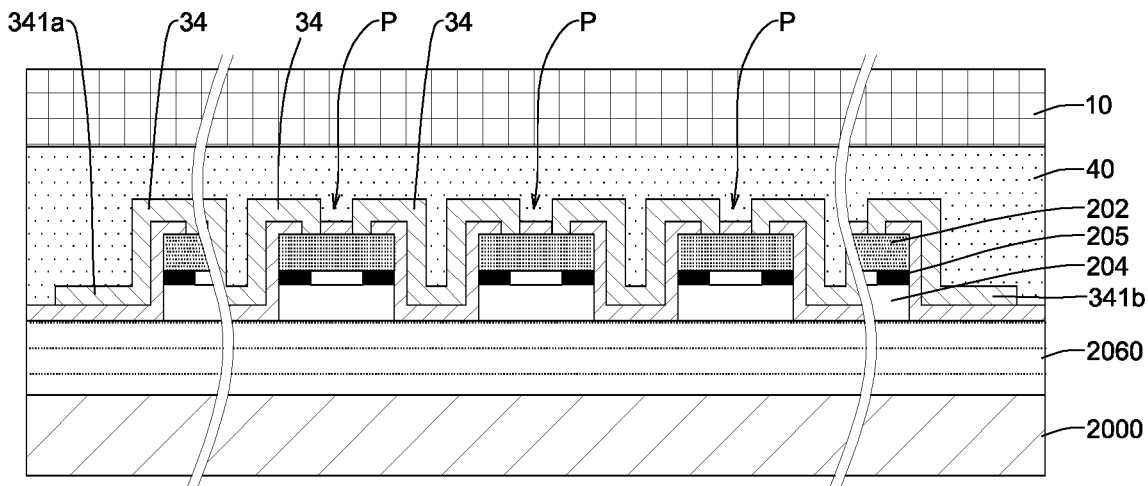
Figure 2G:
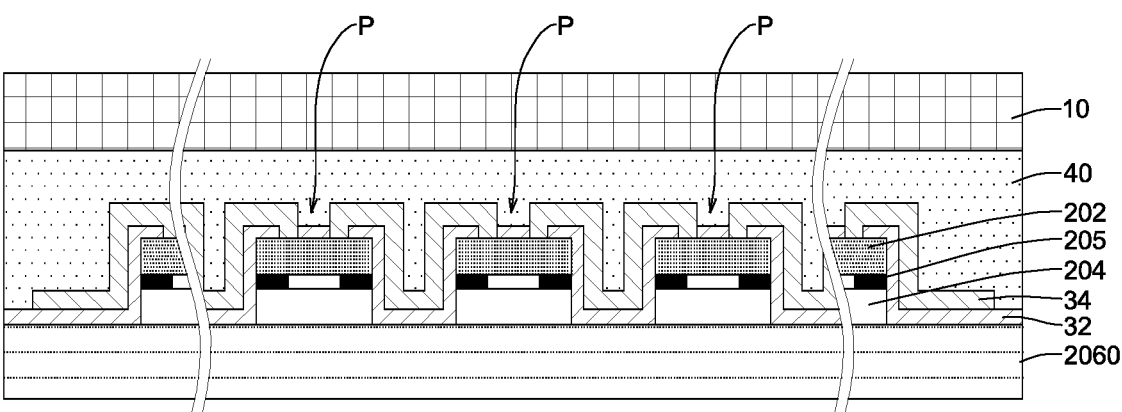

Referring to FIG. 2F, the columnar bodies P and the second semiconductor stack 2060 is connected to the permanent substrate 10 by the adhesive layer 40. In this embodiment, the permanent substrate 10 is made of a material which is highly penetrable by the light emitted from the active structure 204 (such as sapphire with transmittance greater than 80%). After connecting to the permanent substrate 10, the first protruding portion 341a and the second protruding portion 341b are farther from the permanent substrate 10 than the first semiconductor structure 202 is. Next, the growth substrate 2000 is removed from the second semiconductor stack 2060, as shown in FIG. 2G.

Figure 2H:
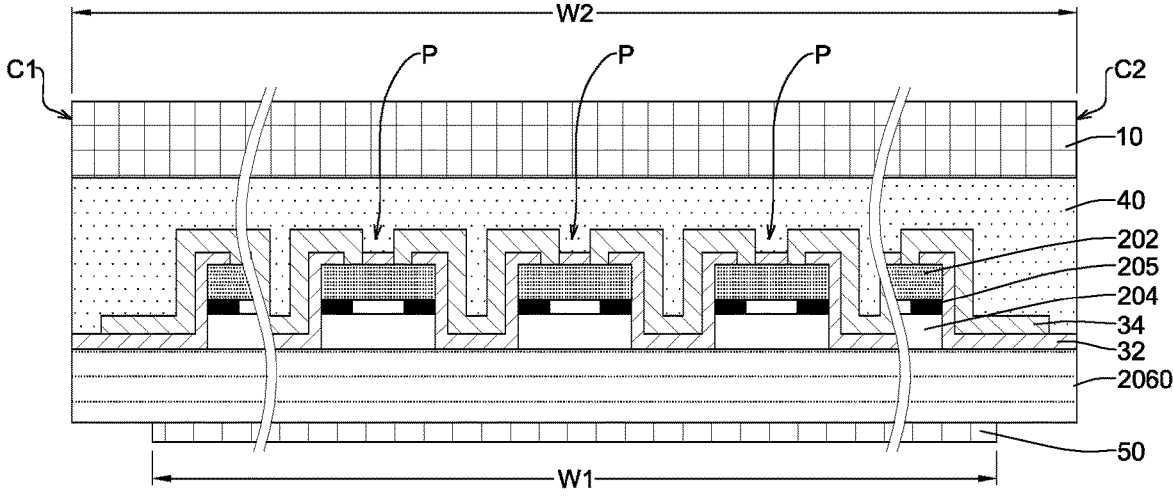

Referring to FIG. 2H, a connection layer 50 is disposed on the second semiconductor stack 2060 and is exposed as a result of the removal of the growth substrate 2000. The cross-sectional view shows that the width W1 of the connection layer 50 is less than the width of the second semiconductor stack 2060 in order to expose a part of the second semiconductor stack 2060. The width W1 of the connection layer 50 is less than the width W2 of the substrate 10.

Figure 2I:
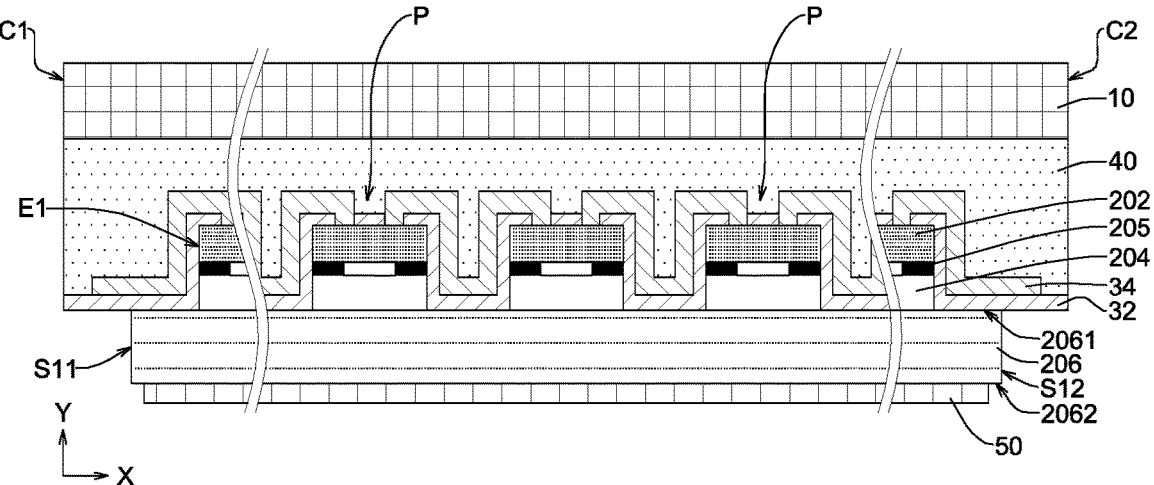

Referring to FIG. 2I, an etching process is performed to remove the peripheral region (which is near the first side surface C1 and second side surface C2) of the second semiconductor stack 2060 so as to form the second semiconductor structure 206. The plurality of columnar bodies P has a first edge E1 near the first side surface C1. The second semiconductor structure 206 has the third lateral surface S11 which is near the first side surface C1. In the direction of axis X in FIG. 2I, the third lateral surface S11 is closer to the first side surface C1 than the first edge E1 is. Furthermore, the connection layer 50 has a lateral surface closer to the first side surface C1 than the first edge E1 is. All the lateral surfaces of the connection layer 50 are closer to the side surface than the edges of the plurality of columnar bodies P is. In other words, the connection layer 50 covers all the columnar bodies P. In another embodiment, all the lateral surfaces of the connection layer 50 are farther from the side surface than the edges of the plurality of columnar bodies P is and therefore the connection layer 50 covers only some of the columnar bodies P.

In addition to the top surface 2061 facing the permanent substrate 10, the second semiconductor structure 206 further includes the lower surface 2062 away from the permanent substrate 10 and opposite to the top surface 2061. The third lateral surface S11 and the fourth lateral surface S12 connect the top surface 2061 and the lower surface 2062.

Figure 2J:
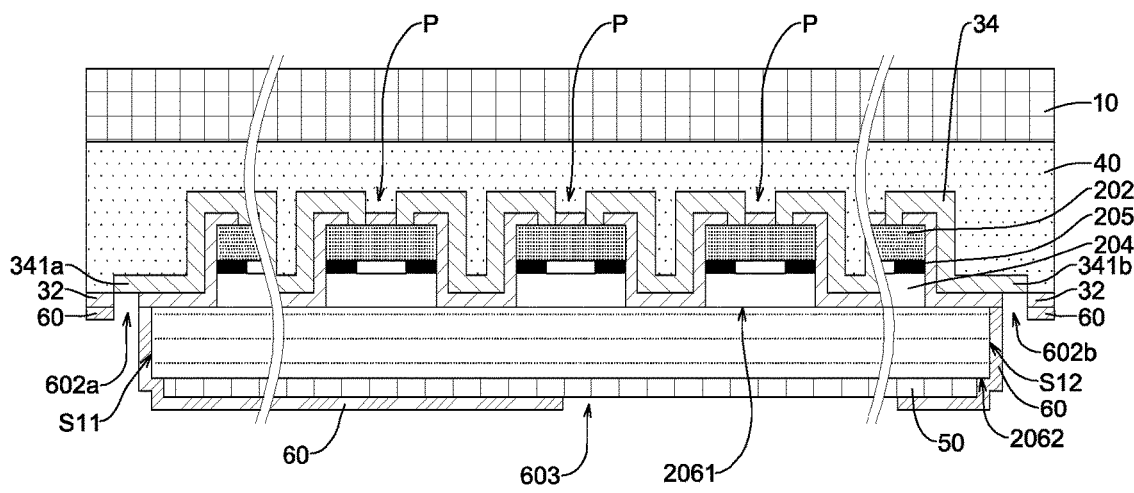

Referring to FIG. 2J, the insulating layer 60 is on the second semiconductor structure 206 to cover the third lateral surface S11, the fourth lateral surface S12, a part of the lower surface 2062, and a part of the connection layer 50. Next, portions of the insulating layer 32 and the insulating layer 60 are removed from the peripheral region of the connection layer 34 to form the opening portions 602a~602d and expose a portion of the connection layer 34 (such as the first and second protruding portions 341a, 341b). The insulating layer 60 has the fifth opening portion 603 to expose part of the connection layer 50.

Figure 2K:
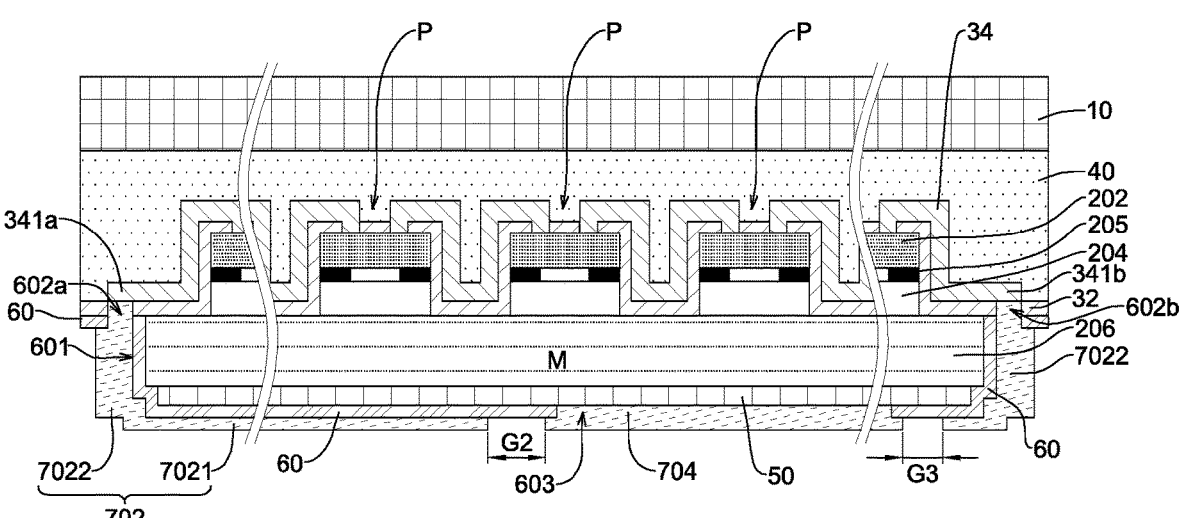

Referring to FIG. 2K, a first electrode 702 and a second electrode 704 are on the insulating layer 60. The first electrode 702 is in direct contact with and is electrically connected to the connection layer 34 through the opening portions 602a~602d (FIG. 2K merely shows the first opening portion 602a and the second opening portion 602b). The second electrode 704 is connected to the connection layer 50 through the fifth opening portion 603.

Figure 2L:
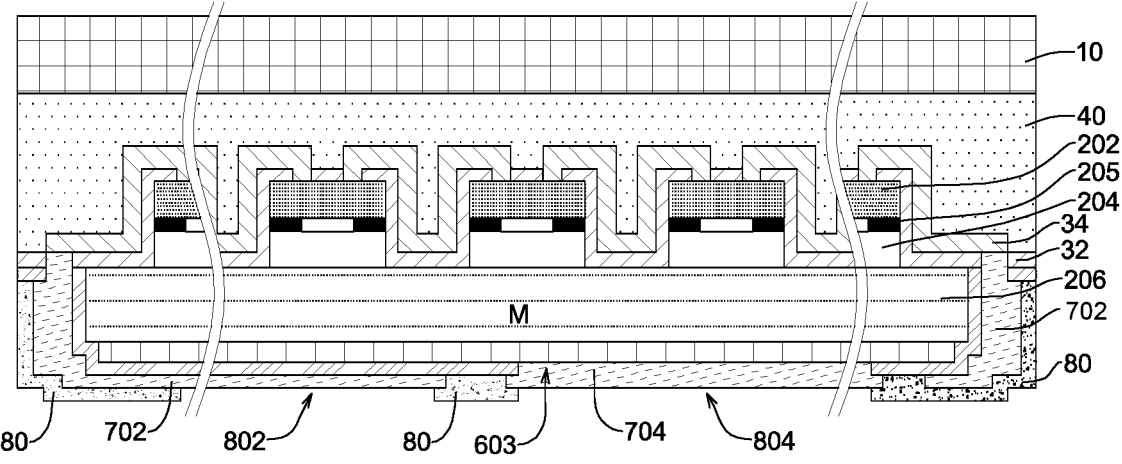

Referring to FIG. 2L, the insulating layer 80 is provided to cover a part of the first electrode 702 and a part of the second electrode 704. The insulating layer 80 has the first hole 802 for exposing the first electrode 702 and the second hole 804 for exposing the second electrode 704.

After that, the first pad structure 902 and the second pad structure 904 are on the first insulating layer 80. The first pad structure 902 is electrically connected to the first electrode 702 through the first hole 802, and the second pad structure 904 is electrically connected to the second electrode 704 through the second hole 804, so as to form the laser device 100 shown in FIG. 1A. The surface of a part of the first pad structure 902 is substantially flush with the surface of the second pad structure 904 for facilitating connection between the laser device 100 and an external circuit by solder.

Figure 3A:
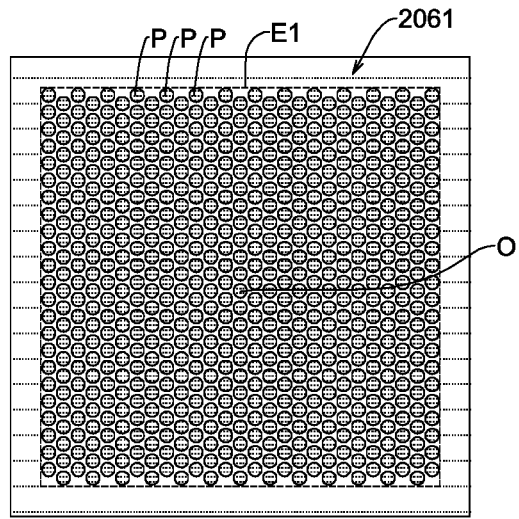
Figures 3B, 3C:
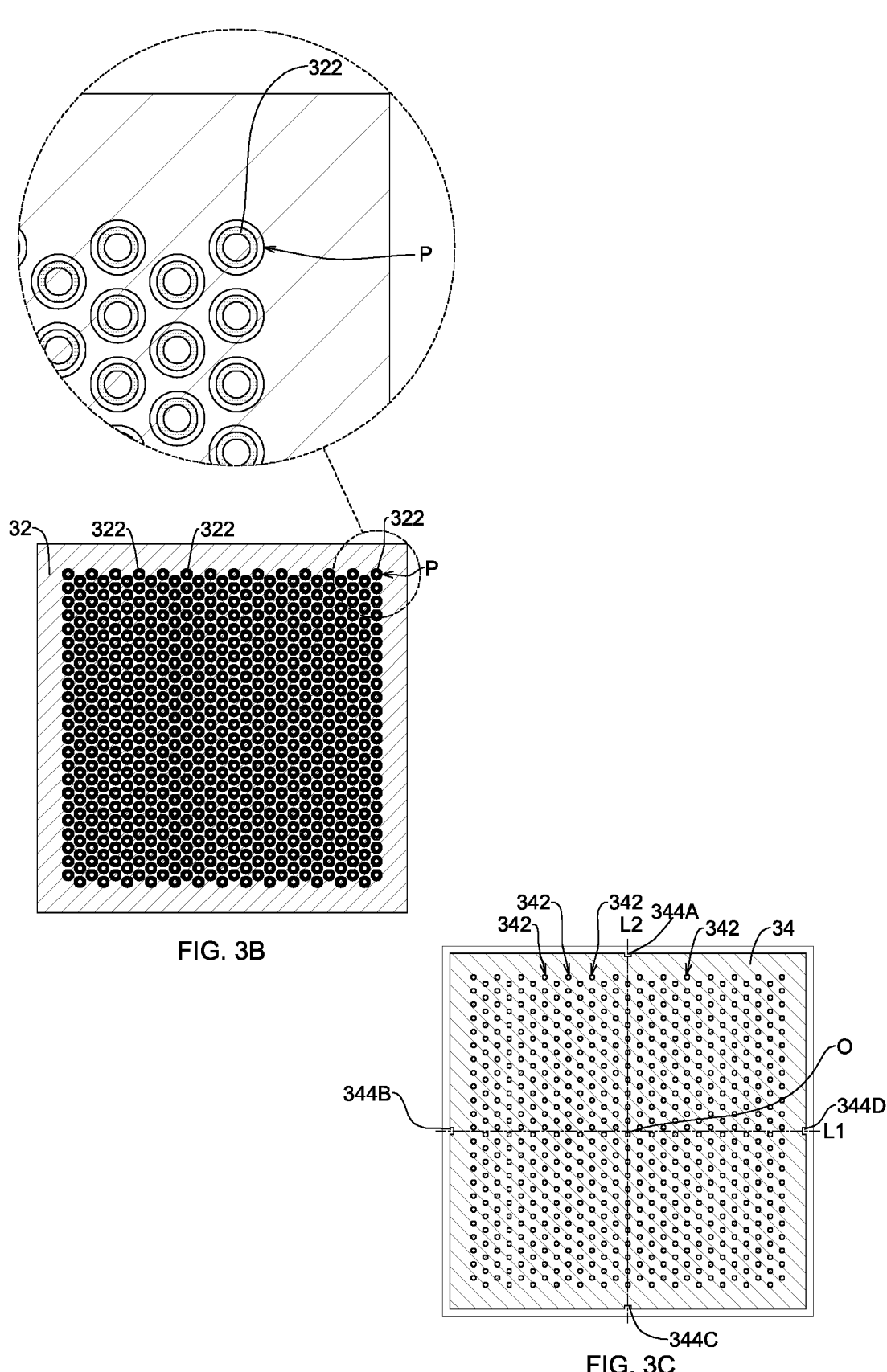

FIG. 3A through FIG. 3I are top views or bottom views of respective resultant structures in all the steps of the production process of the laser device according to an embodiment of the present disclosure. FIG. 3A through FIG. 3C are top views of the structures of three steps of the production process of the laser device. FIG. 3D through FIG. 3I are bottom views of the structure of six steps of the production process of the laser device.

FIG. 3A is a top view based on FIG. 2B. In this embodiment, the columnar bodies P are in the number of 621, tightly packed, and regularly arranged in an array.

FIG. 3B includes a top view based on FIG. 2D and a partially enlarged view thereof. As shown in the top view, the insulating layer 32 covers the plurality of columnar bodies P and has the plurality of first vias 322 for exposing the upper surfaces P1 of the plurality of columnar bodies P.

FIG. 3C is a top view based on FIG. 2E. The connection layer 34 covers the insulating layer 32 and has the plurality of second vias 342. The second vias 342 are located above the upper surfaces P1 of the corresponding columnar bodies P to form a plurality of light emission holes of the laser device 100. Four marking structures 344A~344D are disposed at the four edges of the connection layer 34, respectively. The marking structures 344B, 344D are opposite to each other and connected to define the line L1, and the marking structures 344A, 344C are opposite to each other and connected to define the line L2. The line L1 and the line L2 are intersected at a central point O.

FIG. 3D is a bottom view based on FIG. 2H. The connection layer 50 is on the second semiconductor stack 2060.

FIG. 3E is a bottom view based on FIG. 2I. The peripheral region of the second semiconductor stack 2060 is removed to form the second semiconductor structure 206.

FIG. 3F is a bottom view based on FIG. 2J. Referring to FIG. 3F, the insulating layer 60 is provided, and parts of the insulating layer 60 and the insulating layer 32 are removed to form the first opening portion 602a, the second opening portion 602b, the third opening portion 602c, and the fourth opening portion 602d for exposing a portion of the connection layer 34. For example, in a cross-sectional view of FIG. 2J, the first protruding portion 341a and the second protruding portion 341b are exposed from the insulating layer 60. The insulating layer 60 further has a fifth opening portion 603 for exposing the connection layer 50. In this embodiment, the four opening portions 602a~602d are provided and surround the second semiconductor structure 206. Each of the four opening portions 602a~602d is L-shaped. The four opening portions 602a~602d are not connected to each other, and each of the four spacing G11~G14 are provided between two neighboring opening portions. The four spacing G11~G14 correspond to the marking structures 344A~344D, respectively. Referring to FIG. 4, in another embodiment, the four opening portions 602a~602d of the insulating layer 60 are connected to each other (so there is no spacing G11~G14) to form a ring-shaped configuration which surrounds the laser device 100. In other words, the insulating layer 60 has only one opening portion and looks like a square frame.

FIG. 3G is a bottom view based on FIG. 2K. The first electrode 702 and the second electrode 704 are disposed on the connection layer 34 and the connection layer 50, respectively. In this embodiment, the first electrode 702 includes a body portion 7021 and a surrounding portion 7022 connected to the body portion 7021. The first electrode 702 has a larger area than the second electrode 704 in a plan view. The dashed line in FIG. 3G indicates the boundary between the body portion 7021 and the surrounding portion 7022. The body portion 7021 is square in shape. The surrounding portion 7022 looks like a square frame. Referring to FIG. 4, when the insulating layer 60 has only one opening portion, the surrounding portion 7022 (as shown in FIG. 3C) has the same shape as the opening portion (i.e., looking like a square frame). In addition, the surrounding portion 7022 completely covers the opening portion and has a larger area than the opening portion in a plan view.

Referring to FIG. 2K and FIG. 3G, the surrounding portion 7022 surrounds the second electrode 704 and is in contact with the connection layer 34 through the four opening portions 602a~602d (FIG. 2K merely shows the first opening portion 602a and the second opening portions 602b), so as to electrically connect the first semiconductor structure 202 and the first electrode 702. Similarly, the second electrode 704 is in contact with the connection layer 50 through the fifth opening portion 603, so as to electrically connect the second semiconductor structure 206 and the second electrode 704. Furthermore, the body portion 7021 and the second electrode 704 are separated by a second gap G2, and the surrounding portion 7022 and the second electrode 704 are separated by a third gap G3. The third gap G3 is narrower than the second gap G2.

FIG. 3H is a bottom view based on FIG. 2L. The insulating layer 80 is disposed on the first electrode 702 and the second electrode 704. The insulating layer 80 has the first hole 802 and the second hole 804 to expose the body portion 7021 of the first electrode 702 and the second electrode 704, respectively.

FIG. 3I is a bottom view based on FIG. 1A. Referring to FIG. 1A and FIG. 3I, the first pad structure 902 and the second pad structure 904 are provided. The first pad structure 902 is connected to the first electrode 702 through the first hole 802. The second pad structure 904 is connected to the second electrode 704 through the second hole 804.

The laser device 100 in an embodiment of the present disclosure is a flip-chip laser device operable at short pulses and high currents. A conventional vertical laser device has electrodes on two opposing sides of a permanent substrate for metallic wire bonding. By contrast, in this embodiment of the present disclosure, the laser device 100 can be operated with high currents without undergoing additional metallic wire bonding, thereby increasing the brightness of the light emitted from the laser device 100 and increasing the sensing distance (such as to 10 meters). Moreover, being capable of electrically connecting to an external circuit without the need of additional metallic wire bonding, the problem from the parasitic capacitance is improved so the laser device 100 can respond promptly when being operated at high frequencies. Furthermore, the laser device 100 of the present disclosure has high response speed, such as, short signal rise time $T_r$ and short signal fall time $T_f$, and an enhanced reliability.

Referring to FIG. 1A, in an embodiment of the present disclosure, the height H of the first electrode 702 is substantially equal to the epitaxial layer thickness of the second semiconductor structure 206. The height H of the first electrode 702 is less than 8.5 μm, such as 5 μm~8 μm, or 5.5

μm~7 μm. The height H falls within the aforesaid ranges, which can effectively prevent electrical failure caused by unsatisfactory lateral surface coverage during the manufacturing process of forming the first electrode 702 and can reduce the current path of the laser device 100 to facilitate efficient current transmission.

Furthermore, in the laser device 100 of an embodiment of the present disclosure, each the insulating layer 80 is provided between the first electrode 702 and the first pad structures 902 and between the second electrode 704 and the second pad structures 904 which prevents electrode performance deterioration caused by an eutectic structure producing from solder (such as metallic solder paste) reacting with an electrode material (such as gold) at a high temperature when the laser device 100 is operated with high currents. Therefore, the laser device 100 of the present disclosure has an enhanced reliability.

In an embodiment of the present disclosure, the second semiconductor structure 206 is substantially located at the central point of the laser device 100, such that the first pad structure 902 and the second pad structure 904 can be positioned symmetrically on the laser device 100 to facilitate a subsequent packaging process and increase effective regional area.

Referring to FIG. 5, in an embodiment of the present disclosure, a semiconductor apparatus 300 includes the laser device 100, an optical array B1 and a circuit board B2. The laser device 100 is disposed on the circuit board B2 and electrically connected to a first electrode pad B21 and a second electrode pad B22 of the circuit board B2. The first pad structure 902 and the second pad structure 904 of the laser device 100 are electrically connected to the first electrode pad B21 and the second electrode pad B22 by solder (not shown). The optical array B1 includes optical structures B11. In another embodiment, the optical array B1 is a microlens array, and the optical structures B11 are arranged regularly or randomly, such that the light emitted from the laser device 100 can spread, thereby broadening the field of view (FOV). The laser device 100, the optical array B1 and the circuit board B2 are connected by a support B3. In the embodiments of the present disclosure, the laser device 100 is highly efficient in heat dissipation and especially suitable for use with flood illuminators and 3D sensing apparatuses required to perform distance sensing pertaining to time of flight ToF. However, the aforesaid disclosure is not intended to place limitations on the applications of the laser device 100.

Although the present disclosure is disclosed above by embodiments, the embodiments are illustrative of the present disclosure rather than restrictive of the scope of the present disclosure. No modifications and changes made by persons skilled in the art to the present disclosure may be deemed departing from the spirit and scope of the present disclosure. Identical physical or chemical characteristics are manifested by identical or similar components in different embodiments or by components denoted by identical reference numerals in different embodiments. Furthermore, under suitable conditions, the aforesaid embodiments of the present disclosure can be combined together or replaced by each other, and thus the present disclosure is not limited to the aforesaid specific embodiments. The connection relationships of specific components and other components described in an embodiment of the present disclosure may also be applicable to the other embodiments and must be deemed falling within the scope of the appended claims of the present disclosure.

What is claimed is:

1. A semiconductor device, comprising:
   a substrate comprising a first side surface and a second side surface;
   a first type semiconductor structure comprising a first surface, a second surface opposite the first surface and away from the substrate, a first extension, and a second extension;
   semiconductor columnar bodies located between the substrate and the first type semiconductor structure, and the semiconductor columnar bodies comprising a first columnar body adjacent to the first side surface and a second columnar body adjacent to the second side surface;
   a first electrode on the second surface of the first type semiconductor structure; and
   a second electrode on the second surface of the first type semiconductor structure.

2. The semiconductor device of claim 1, wherein one of the semiconductor columnar bodies comprises a second type semiconductor structure, a current confinement layer and an active structure.

3. The semiconductor device of claim 1, further comprising an adhesive layer between the substrate and the semiconductor columnar bodies.

4. The semiconductor device of claim 1, further comprising a first connection layer on the second surface of the first type semiconductor structure, wherein the first connection layer has a width is smaller than a width of the first type semiconductor structure.

5. The semiconductor device of claim 1, further comprising a second connection layer between the substrate and the first type semiconductor structure, and the second connection layer comprising a first protruding portion extending beyond the first extension and a second protruding portion extending beyond the second extension.

6. The semiconductor device of claim 5, wherein the second connection layer is provided with a plurality of marking structures.

7. The semiconductor device of claim 1, further comprising a first pad structure and a second pad structure, wherein the first electrode is between the first pad structure and the first type semiconductor structure, and the second electrode is between the second pad structure and the first type semiconductor structure.

8. The semiconductor device of claim 7, wherein the first pad structure and the second pad structure comprise an element, but neither the first electrode nor the second electrode comprises the element.

9. The semiconductor device of claim 8, wherein the element comprises nickel (Ni), platinum (Pt), or both.

10. The semiconductor device of claim 7, further comprising an insulating layer between the first electrode and the first pad structure and between the second electrode and the second pad structure.

11. The semiconductor device of claim 1, further comprising an insulating layer between the first electrode and the first type semiconductor structure, wherein the first type semiconductor structure comprises a lateral surface between the first surface and the second surface, and the first electrode extends from the second surface to the lateral surface and is electrically connected to one of the semiconductor columnar bodies.

12. The semiconductor device of claim 11, wherein the insulating layer extends from the second surface to the first surface.

13. The semiconductor device of claim 11, wherein the insulating layer includes an opening portion adjacent to the first surface, wherein the first electrode extends from the second surface to the opening portion, and the opening portion is distributed within a peripheral region of the substrate.

14. The semiconductor device of claim 1, wherein the first electrode has a height, and the first type semiconductor structure has an epitaxial thickness substantially equal to the height.

15. A semiconductor device, comprising:

a first type semiconductor structure comprising a first surface, a second surface opposite the first surface, a first lateral surface and a second lateral surface between the first surface and the second surface;

semiconductor columnar bodies on the first surface of the first type semiconductor structure, and the semiconductor columnar bodies comprising a first columnar body adjacent to the first lateral surface and a second columnar body adjacent to the second lateral surface;

a connection layer on the semiconductor columnar bodies and extending to the first surface of the first type semiconductor structure;

a first electrode on the second surface of the first type semiconductor structure; and a second electrode on the second surface of the first type semiconductor structure;

wherein the connecting layer includes a first protruding portion extending beyond the first lateral surface of the first type semiconductor structure and a second protruding portion extending beyond the second lateral surface of the first type semiconductor structure, and the first electrode connects to the first protruding portion.

16. The semiconductor device of claim 15, further comprising an insulating layer between the first electrode and the first type semiconductor structure, the insulating layer comprising opening portions.

17. The semiconductor device of claim 16, wherein the first lateral surface of the first type semiconductor structure is between one of the opening portions and the first columnar body, the first electrode connects to the first protruding portion through the one of the opening portions.

18. The semiconductor device of claim 16, wherein the second lateral surface of the first type semiconductor structure is between one of the opening portions and the second columnar body.

19. The semiconductor device of claim 18, wherein the first electrode connects to the second protruding portion through the one of the opening portions.

20. The semiconductor device of claim 16, wherein the opening portions position beyond the first lateral surface or the second lateral surface.

* * * * *